(12) United States Patent
Anderson et al.

(10) Patent No.: US 8,638,024 B2
(45) Date of Patent: Jan. 28, 2014

(54) ACTUATOR

(75) Inventors: Iain Alexander Anderson, Auckland (NZ); Benjamin Marc O'Brien, North Shore (NZ); Thomas Gregory McKay, Auckland (NZ); Todd Alan Gisby, North Shore (NZ); Emilio Patricio Calius, Auckland (NZ); Scott Hayden Walbran, Auckland (NZ); Thomas Swithun Hale, Auckland (NZ)

(73) Assignee: Auckland UniServices, Limited (NZ)

( * ) Notice: Subject to any disclaimer, the term of this patent is extended or adjusted under 35 U.S.C. 154(b) by 425 days.

(21) Appl. No.: 12/920,264

(22) PCT Filed: Feb. 27, 2009

(86) PCT No.: PCT/NZ2009/000025
§ 371 (c)(1),
(2), (4) Date: Jan. 19, 2011

(87) PCT Pub. No.: WO2009/108072
PCT Pub. Date: Sep. 3, 2009

(65) Prior Publication Data
US 2011/0101823 A1    May 5, 2011

(30) Foreign Application Priority Data

Feb. 29, 2008 (NZ) .......................... 566348
May 22, 2008 (NZ) .......................... 568571

(51) Int. Cl.
*H01L 41/09*    (2006.01)
*H02N 2/10*    (2006.01)

(52) U.S. Cl.
CPC ............ *H01L 41/0986* (2013.01); *H02N 2/105* (2013.01); *Y10S 310/80* (2013.01)
USPC ........................................ 310/323.02; 310/800

(58) Field of Classification Search
CPC ............................ H01L 41/0986; H02N 2/105
USPC ........................ 310/323.01–323.21, 328, 800
See application file for complete search history.

(56) References Cited

U.S. PATENT DOCUMENTS 6,084,321 A    7/2000   Hunter et al.
6,664,718 B2   12/2003  Pelrine et al.
(Continued)

FOREIGN PATENT DOCUMENTS

WO       9907997       2/1999
WO       2007096477    8/2007

OTHER PUBLICATIONS

Zhou et al., "Development of a Magnetostrictive Drive Rotary Motor Driven by Circular Parallel Movement," IOP Publishing, Smart Materials and Structures, 16 (2007) 2063-2066.

(Continued)

*Primary Examiner* — Derek Rosenau
(74) *Attorney, Agent, or Firm* — Lowe Graham Jones PLLC

(57) ABSTRACT

The invention provides an actuator for an electric motor and an electric motor including said actuator. The actuator includes one or more body formed from a dielectric elastomer, each body having at least one active region that is directly or indirectly coupled to a drive means. The active regions are arranged such that, in use, actuation thereof causes driven means to move with components in at least first and second directions, preferably within a plane of the body.

16 Claims, 10 Drawing Sheets

(56) References Cited

U.S. PATENT DOCUMENTS

| | | | |
|---|---|---|---|
| 6,806,621 | B2 | 10/2004 | Heim et al. |
| 6,847,155 | B2 | 1/2005 | Schwartz et al. |
| 6,911,764 | B2 * | 6/2005 | Pelrine et al. ............ 310/328 |
| 7,034,439 | B2 * | 4/2006 | Richter ..................... 310/328 |
| 7,166,953 | B2 | 1/2007 | Heim et al. |
| 7,456,549 | B2 | 11/2008 | Heim et al. |
| 2002/0008445 | A1 | 1/2002 | Pelrine et al. |
| 2002/0050769 | A1 | 5/2002 | Pelrine et al. |
| 2002/0175598 | A1 | 11/2002 | Heim et al. |
| 2003/0038563 | A1 | 2/2003 | Baudendistel |
| 2007/0200457 | A1 | 8/2007 | Heim et al. |
| 2008/0001499 | A1 | 1/2008 | Fleytman |

OTHER PUBLICATIONS

Haruna et al., "Development of Soft Actuator: Mechanism with Vibration Element Using Dielectric Elastomer to Generate Large Displacement," Proc. of SPIE, vol. 6524, 652418 (2007) 10 pages.

Anderson, et al., "A Thing Membrane Artificial Muscle Rotary Motor," Applied Physics A, Materials Science & Processing, 98: 75-83, 2010.

McKay et al., "Electro-active Polymer Power Generation," Biomimetics Laboratory, Auckland Bioengineering Institute, The University of Auckland, New Zealand, Apr. 16, 2009.

Nef et al., "ARMin—Design of a Novel Arm Rehabilitation Robot," Proceedings of the 2005 IEEE, 9th International Conference on Rehabilitation Robotics, Jun. 28-Jul. 1, 2005; pp. 57-60.

Pelrine et al., "Applications of Dielectric Elastomer Actuators," SRI International, Smart Structures and Materials, Proceedings of SPIE vol. 4329; pp. 335-349; 2001.

Pelrine, et al., "Electrostriction of Polymer Dielectrics with Compliant Electrodes as a Means of Actuation," Elsevier, Sensors and Actuators A, 64; 77-85; 1998.

Prahlad, et al., "Polymer Power: Dielectric Elastomers and Their Applications in Distributed Actuation and Power Generation," Proceedings of ISSS; pp. 100-107; 2005.

Pelrine, et al., "High-Field Deformation of Elastomer Dielectrics for Actuators," Elsevier, Materials Science and Engineering; C 11; 89-100; 2000.

Kofod et al., "Self-Organized Minimum-Energy Structures for Dielectric Elastomer Actuators," Applied Physics A, Materials Science & Processing, A 85, pp. 141-143, 2006.

Kofod, et al., "New Design Concept for Dielectric Elastomer Actuators," Smart Structures and Materials; Electroactive Polymer Actuators and Devices (EAPAD), Proc. of SPIE, vol. 6168. 9 pages, 2006.

Kofod et al., "Energy Minimization for Self-Organized Structure Formation and Actuation," Applied Physics Letters 90, 081916, 4 pages, 2007.

* cited by examiner

ACTUATOR

PRIORITY CLAIM

This application claims priority to International Application Number PCT/NZ2009/000025, filed Feb. 27, 2009, which claims priority to NZ application 566348, filed Feb. 29, 2008, and to NZ application 568571, filed May 22, 2008, each of which is incorporated by reference.

FIELD OF THE INVENTION

The invention relates to actuators. More particularly, the invention relates to rotary actuators and/or actuators for a motor, particularly a rotary motor, and a motor in which drive is created using a dielectric elastomer actuator.

BACKGROUND OF THE INVENTION

An electro-active polymer (EAP) is a soft actuator that can generate high stress and large strain. A dielectric elastomer actuator (DEA) is an EAP which uses a dielectric elastomer film or membrane with a flexible electrode attached to each face. Application of a voltage difference across the electrodes generates Maxwell stress. The two electrodes are urged together by electrostatic attraction of free charges on the electrodes, causing the thickness of the membrane to decrease and the surface area of the faces to increase. This transformation is further effected by electrostatic repulsion of like charges on each individual face. Thus, application of a voltage to the electrodes causes the membrane to expand in area and compress in thickness.

Pelrine et al. in "Electrostriction of polymer dielectrics with compliant electrodes as a means of actuation", Sensors and Actuators A 64, 77-85 (1998) describe the basic principles behind DEAs and a linear actuator based thereon.

DEAs are described by Masaki Haruna et al. in "Development of Soft Actuator: Mechanism with Vibration Element Using Dielectric Elastomer to Generate Large Displacement", Electroactive Polymer Actuators and Devices, Proc. of SPIE Vol. 6524, 652418 (2007). Masaki et al. also describe a vibration element that acts as a linear actuator and has a dielectric elastomer held at its edges by opposing frame members. The element includes two pairs of opposing electrodes formed on the elastomer. The first pair is positioned at a first end of the element and the second pair is positioned at the second opposing end and spaced apart from the first pair, such that the first pair of electrodes is isolated from the second pair. Each pair forms a driven area and they are actuated alternately through application of a voltage to each pair of electrodes. A push-rod is attached to the elastomer (preferably at the boundary between the driven areas) and moves backwards and forwards as the voltage is applied to the alternate pairs of electrodes. A ratchet mechanism enables the push-rod to drive an output-rod in a single direction.

Zhou, J., Huang, M., Wang, X. and Song, W. in "Development of a magnetostrictive drive rotary motor driven by circular parallel movement", Smart Materials and Structures 16 (2007) 2063-2066 describe a rotary motor constructed of three magnetostrictive actuators connected to a stator frame with a rotor placed in the centre of the stator. Magnetostriction is the change in shape of a material due to a change in its magnetization. Movement of the actuators is scaled up using bulky flexible flexure hinges and combined using a mechanism which enables a pure rotation movement for driving the rotor of the motor.

U.S. Pat. No. 6,084,321 describes a rotary actuator having a substantially planar sheet of anisotropic conducting polymer, portions of which may be activated in sequence to produce crank rotation. U.S. Pat. No. 6,806,621 describes arrangements using EAPs to rotate a crank.

SUMMARY OF THE INVENTION

It is an object of the invention to provide an improved actuator, particularly a rotary actuator or an actuator for an electric motor.

Alternatively, it is an object to provide an improved motor, particularly a rotary motor.

Alternatively, it is an object to provide at least a useful choice to the public.

According to a first aspect of the invention, there is provided an actuator including:

one or more body formed from a dielectric elastomer, each body having at least one active region; and a drive means directly or indirectly coupled to each active region, wherein:

an engaging portion of the drive means is configured to engage a driven means such that only a part of the engaging portion is operably engaged with the driven means at any point in time;

the active region(s) is arranged such that, in use, actuation thereof causes the part of the engaging portion engaged with the driven means to change and the drive means to move, the motion of the drive means including components in at least first and second directions, and;

the second direction is offset or non-parallel to the first direction.

Since the movement has components in at least first and second directions that are offset from one another (and not simply opposite), the actuator of the invention has wide application including for generating motion having a rotary component.

Preferably, the actuator includes at least two said active regions.

Preferably, each active region is defined by a pair of electrodes coupled to or integral to the dielectric elastomer of the corresponding body.

Preferably, the electrodes of each pair of electrodes are provided on opposing surfaces of the corresponding body.

Preferably, the electrodes of each pair of electrodes are substantially electrically isolated from electrodes of other pairs to enable each active region to be independently actuated. This may be affected, for example, by spacing apart any one pair of electrodes from other electrodes on the same body such that there is a "dead zone" therebetween. Additionally or alternatively, insulating material may be provided between adjacent active regions.

Individual electrodes may form a part of more than one working pair of electrodes.

The electrodes are configured to allow the dielectric elastomer to deform as desired. To this end, the electrodes may be formed from a compliant material. Additionally or alternatively, the electrodes may be structurally configured to enable the elastomer to expand and contract.

Preferably, the actuator includes or is adapted to be coupled to means for applying a voltage to the electrodes of each active region.

Preferably, the means for applying a voltage is configured to apply a voltage to each active region independently.

Preferably, the means for applying a voltage is configured to apply a voltage to each active region. More preferably, the means for applying are configured to apply voltage differences in a controlled manner and/or desired and/or predetermined sequence, so as to generate a desired motion. Note that said manner or sequence may be adaptive, based on any operational parameters and/or user input.

More than one active region may be actuated at any given point in time.

Means for applying a voltage are known to those skilled in the art and may include conductive tracks and/or wires for selectively coupling the electrodes to a power supply.

For dielectric elastomers, the level of actuation or amount of deformation is proportional to the square of the applied voltage. Depending on the particular application of the invention, performance may be improved by varying the waveform of the applied voltage. For example, a substantially square waveform may be used whereby no or a first voltage (greater than 0V) is applied when an active region is inactivated and a second set voltage is applied when an active region is actuated, the second voltage being higher than the first voltage. For some applications, this waveform may be smoothed so as to achieve smoother movement by increasing/decreasing the voltage between the first and second voltages in discrete steps or alternatively continuously, including so the waveform is substantially sinusoidal. Depending on operating characteristics, more than one actuation or second voltage may be used such that, for example, a higher voltage is applied when there is a greater load or higher speed is needed.

Thus, references herein to "actuated" and "inactivated" are relative terms and do not necessarily mean that an active region is fully actuated or completely inactivated.

The shape of each body may be selected as desired depending on the particular application. According to preferred embodiments, one or more bodies are in the form of a membrane. According to one embodiment, one or more bodies have a tubular configuration. Other configurations may additionally or alternatively be used, including contouring. Where an actuator has multiple bodies, each body may have the same or a different configuration.

Preferably, the actuator includes support means for supporting the one or more body. Particularly for bodies in the form of a membrane, the support means may be used for positioning and support.

Preferably, the support means includes one or more frame members coupled to or integral to the body or at least one of a plurality of bodies.

According to preferred embodiments, the frame member(s) is provided at or towards at least one edge of the or at least one body.

Preferably, the support means is formed from a substantially rigid plastic, although the invention is not limited thereto.

According to preferred embodiments, the or each body is stretched prior to coupling thereof to a frame member. Different amounts of pre-stretching may be performed in different directions so as to achieve a desired change in configuration when an active region is actuated.

Preferably, the drive means is formed by or coupled to an edge portion of at least one said body.

Preferably, the edge portion is formed by an aperture in the one or more body. The walls of the aperture may be defined by more than one active region.

According to one embodiment, the drive means includes a ring or substantially annular element coupled to the edge portion.

The active areas are configured such that the drive means is urged in different directions so as to create a desired motion (ultimately to driven means such as a shaft), which may be predetermined and/or adaptive or controlled. To provide for improved resolution in the directions in which the drive means may be urged, more than one active area may be actuated at any one time. Furthermore, different active areas may be actuated to different levels at particular points in time. For example, where the voltage is applied using a sinusoidal waveform, the voltage applied to one active area may be increasing as the voltage applied to a second active area is decreasing. As a further alternative, additional active areas may be provided which urge the drive means in different directions.

Preferably, the drive means is configured to couple to driven means such as a shaft.

Preferably, the internal surface of the drive means is configured to couple to the outer wall of the shaft. More preferably, only a portion of the internal surface of the drive means is configured to couple to the shaft at any point in time.

Preferably, the actuator includes the shaft.

Preferably, the shaft has a fixed or substantially fixed axis of rotation, at least in directions perpendicular to the shaft. As will become more apparent herein below, the fixing may be achieved by having the shaft engaged with one or more bearing housings or through it being held/gripped in position as a result of actuation of the active areas.

Due to the configuration of the shaft and the internal surface of the drive means, and the fact that the shaft only or substantially only rotates about the axis, the motion of the drive means is converted to rotational motion of the shaft.

Preferably, the internal surface of the drive means and/or the outer surface of the driven means configured to engage one another are configured to prevent slip therebetween. For example, the surfaces may be provided with interlocking teeth. Alternatively, a high friction coating may be used. Other alternatives will be apparent to those skilled in the art and are included within the scope of the invention.

While the aforementioned configuration of the drive means and shaft is preferred, the invention is not limited thereto. Those skilled in the art will be aware of alternative arrangements for generating a rotary motion and others for generating alternative motions. All such alternatives are included with the scope of the invention. For example, arrangements may include a plurality of shafts with each active region being configured to rotate one or more of the shafts. Each of the shafts may have the same or a different axis. Known gearing arrangements, including planetary gears, may be used to derive the desired motion.

Furthermore, while the drive means and the shaft are substantially rigid according to particular embodiments, the invention is not limited thereto. At least a portion of at least one of the elements (including at least a portion of the drive means and/or the driven means) may be deformable so as to, for example, improve the contact between the two elements.

Moreover, according to one embodiment, the drive means is formed from a deformable material such as the material used to form the one or more body or an elastomer such as a silicone rubber, and effectively grips the shaft, preferably at substantially opposing points so as to effect rotation thereof. Such arrangements may be advantageously formed from a single moulding.

According to a first set of embodiments, the at least two active regions of the one or more body are configured to urge the drive means in at least four directions.

Preferably, a first direction is substantially opposite to a second direction.

Preferably, a third direction is substantially opposite to a fourth direction.

Preferably the first and second directions are substantially orthogonal to the third and fourth directions.

According to one particular embodiment, the actuator includes first and second active regions, wherein the first active region is configured to urge the drive means in the first direction on actuation and in the second direction on inactivation, and the second active region is configured to urge the drive means in the third direction on actuation and in the fourth direction on inactivation.

The first and second active regions may be included within the same body or separate bodies.

Preferably, the active regions are fixedly coupled to the drive means.

According to a second particular embodiment, the actuator includes first, second, third and fourth active regions, wherein the first through fourth active regions are configured to urge the drive means in the first through fourth directions, respectively.

More preferably, the first through fourth active regions urge the drive means in the first through fourth directions, respectively, on actuation thereof.

Preferably, the means for applying a voltage is configured to control the voltage applied to the first and second active regions such that the first active region is inactivated as the second active region is actuated and vice versa.

Preferably, the means for applying a voltage is configured to control the voltage applied to the first and second active regions such that the first active region is inactivated as the second active region is actuated and vice versa.

Preferably, the means for applying a voltage is configured to control the voltage applied to the third and fourth active regions such that the third active region is inactivated as the fourth active region is actuated and vice versa.

While on inactivation the first active region may contract to allow movement of the drive means in the second direction through actuation of the second active region, preferably, the first active region is coupled to the drive means such that on inactivation thereof, the drive means is urged in the second direction by the contracting first active region, in addition to being urged (pushed) by the expanding second active region.

Thus, the first and second active regions work together to provide a desired motion in the first and second directions. Similarly, the third and fourth active regions may work together to provided a desired motion in the third and fourth directions. The second, third and/or fourth regions may also be coupled to the drive means such that each active region is able to urge the drive means in two directions.

Preferably, the first and second active regions are provided in a first body and the third and fourth active regions are provided in a second body.

Preferably, the active regions are actuated in pairs.

Preferably, the active regions are actuated in the sequence: second and fourth active regions, second and third active regions, first and third active regions and first and fourth active regions. The reverse sequence may alternatively be used.

According to preferred embodiments, as the second active region is actuated, the first active region is inactivated such that both of these active regions are at least partially actuated at the same time. The same applies as the first active region is actuated, and also to the third and fourth active regions. According to such embodiments, the applied voltage may be based on a sinusoidal waveform.

The actuation sequence may be repeated as desired.

Preferably, the support means includes a first frame coupled to or integral to the first body and a second frame coupled to or integral to the second body.

Preferably, at least a portion of an outer edge of the first and second bodies is coupled to first and second frames, respectively.

More preferably, an entire perimeter of the first and second bodies is coupled to the first and second frames, respectively.

As will be apparent to those skilled in the art, the first frame may be integral to the second frame or may at least include common parts.

According to a second set of embodiments, the actuator includes first, second and third active regions.

Preferably, the three active regions are provided on the same body.

Preferably, the body is in the form of a membrane.

Preferably, the body is substantially planar.

Preferably, actuation of the first through third active regions urge the drive means in first through third directions, respectively.

Preferably, the first direction is approximately 120 degrees from the second and third directions, wherein the second and third directions are similarly spaced apart. Note that there is no requirement for the angular spacings to be the same.

Preferably, the active regions are actuated in pairs.

Preferably, the actuation sequence is as follows: first and second active regions, third and first active regions, second and third active regions. The reverse sequence may alternatively be used. Alternatively, only one active region may be actuated at any one time or the mode of actuation may be alternated between a single active region and a pair of active regions being actuated.

The actuation sequence may be repeated as desired.

The arrangements of the first set of embodiments may be adapted to act in a similar manner to the second set (i.e., along 3 lines). For example, referring to the first set of embodiments, the activation sequence may be: first and third active regions, first and fourth active regions, second active region, such that the drive means is urged in only 3 directions.

Preferably, at least a portion of an outer edge of the body is coupled to a frame.

More preferably, an entire perimeter of the body is coupled to the frame.

Preferably, the body is stretched prior to coupling thereof to the frame.

As will be apparent from the foregoing, any number of active regions and/or any number of bodies may be provided. While, more than one active region may be configured to operate in any given direction, to provide a full range of movement, the active regions are preferably configured to be spaced apart angularly, preferably equally spaced apart such that any given number of active regions provides for maximum versatility. In other words, the difference between the angles of actuation of the active regions may be more generally set as 360/n where n is the number of active regions and is greater than or equal to 2. This may be balanced with other needs. For example, a greater force may be required in one direction than others (for example, a higher force may required upwards where it is necessary to work against gravity) which may be achieved by having active regions configured to work in parallel, or at least to be angularly closer so that they cooperate to provide the higher required force.

Preferably, all active regions are configured to couple to a single drive means. However, as will be apparent to those skilled in the art, the drive means may be formed from a number of spaced apart elements, for example, positioned along different points of a shaft. Where the drive means is in the form of a ring, a single ring may be proportioned such that each body is adjacent one another or spaced apart, as desired (i.e., the length of the ring may be varied) or separate drive means or rings may be provided.

Where bodies are in the form of a membrane, a plurality of bodies may be conveniently configured to work in parallel by stacking them. According to one stacking arrangement, a plurality of bodies are stacked directly on top of each other. If sufficient bodies are stacked together, it may be possible to avoid the requirement for the support means. Stacking bodies can help to prevent out of plane movement. If required, a frame member may be provided on one or both sides of a stack of bodies. According to a second stacking arrangement, each body or each group of bodies is provided with support means. Additional bodies or groups of bodies may then be stacked thereon. Note that a single frame member between two bodies or two groups of bodies may provide support for each body or group of bodies.

Each body, including the support means, may be formed from a composite structure. Similarly, multiple bodies, with or without the support means may be formed from a composite structure.

Where bodies are stacked, appropriate account should be taken of the charge of adjacent electrodes on the surfaces thereof.

As will be apparent to those skilled in the art, additional active regions may be provided in each body so as to provide for increased resolution or smoothness in movement. However, it is important to note that since a dead zone is required between adjacent active regions on the same body, improved performance may be obtained by adding additional bodies with separate active regions rather than defining additional active regions on an existing body.

The active regions may be configured to act against bias means, such as a spring, when the active regions are actuated, whereby on inactivation, the bias means urge the drive means in the opposite direction. The bias means may be offset from urging the drive means in the opposite direction in which the respective active region(s) urge the drive means.

The actuator may include or be coupleable to a flywheel to obtain the attendant advantages thereof. Moreover, according to one embodiment, one or more DEAs are configured to act along a single line (in one or forward and reverse directions), with a flywheel being used to harness the lateral movement as rotational movement. This may be achieved by having at least an initial movement of an active region initiating rotation of the flywheel, with the flywheel encouraging subsequent actuation of the active region to maintain said rotation.

According to one embodiment, actuation in a particular manner causes the drive means to disengage from the driven means or the shaft (i.e., the driven means is positioned substantially centrally of the drive means). This may be used to allow for free rotation of the driven means relative to the drive means or at least that particular drive means, effectively providing for a "neutral gear".

According to a second aspect, there is provided an actuator including:

One or more body formed from a dielectric elastomer, each body having at least one active region; and a drive means directly or indirectly coupled to each active region, wherein:

the drive means is configured to engage a driven means and, in use, move said driven means in at least first and second directions within or substantially within a plane of the one or more body, and the second direction is offset or non-parallel to the first direction.

Preferably, said first and second directions are substantially parallel to the plane of the one or more body.

Preferably, the body is substantially planar.

Other features of the actuator of the second aspect may be drawn from the actuator of the first aspect. Similarly, additional features of the second aspect may be included within the actuator of the first aspect.

Preferably, the actuator of the first or second aspect is a rotary actuator or configured to produce motion having at least a rotary component.

Preferably, the actuator of the first or second aspect is for a motor.

According to a third aspect there is provided a motor including one or more dielectric actuators.

According to preferred embodiments, the motor includes an actuator according to the first or second aspect of the invention.

Preferably, the motor is a rotary motor.

Further aspects of the invention, which should be considered in all its novel aspects, will become apparent to those skilled in the art upon reading of the following description which provides at least one example of a practical application of the invention.

BRIEF DESCRIPTION OF THE DRAWINGS

Embodiments of the invention will now be described, by way of example only, with reference to the accompanying drawings in which.

DETAILED DESCRIPTION OF THE PREFERRED EMBODIMENT

Figure 1:
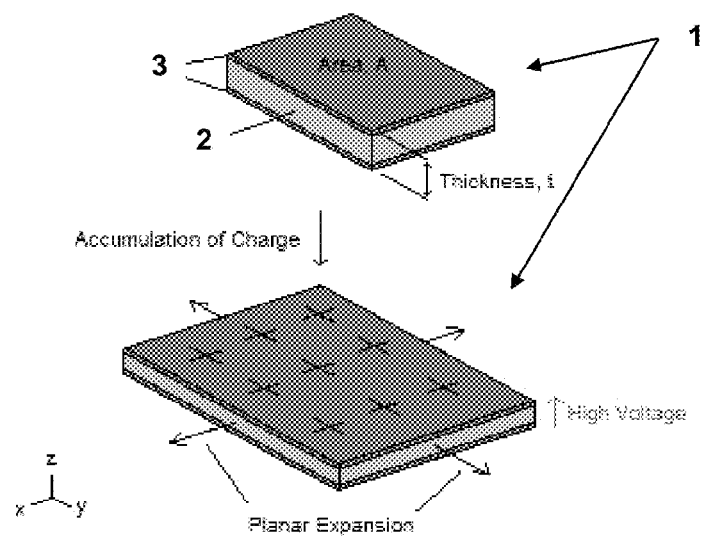
FIG. 1 is a diagram illustrating the actuation process of a dielectric elastomer.

According to the invention, one or more dielectric elastomer actuator (DEA) membranes are used to generate a desired motion from polymer-based DEA actuators which expand in plane with an applied voltage to produce motion. Through proper control of the applied voltage, the motion generated by the DEAs may be translated into a desired motion, preferably a rotary or orbital motion, more preferably a continuous rotary or orbital motion, although the invention is not limited thereto. In addition to motion other than purely rotational, embodiments of the invention may be used to generate oscillating motion or any other desired motion.

According to a first presently preferred non-limiting embodiment, the DEAs act on a ring engaged with a shaft. The shaft has a rotational axis along its longitudinal axis but is preferably otherwise immovable (i.e., the rotational axis is substantially the only degree of freedom). The internal diameter of the ring is greater than the external diameter of the shaft such that only a portion of the two surfaces are in contact at any one point in time. As the ring is urged in different directions by the DEA, the inner surface of the ring acts against the shaft, causing it to rotate. Gear teeth may be provided on the engaging surfaces of the ring and the shaft so as to ensure the reliable translation of motion from the ring to the shaft. Alternatively, a coating with a high coefficient of friction may be used on one or both of the surfaces.

While according to the first embodiment the ring is preferably substantially rigid such that actuation of the active regions causes the drive means to move as a whole (particularly when gear teeth are used), according to a second embodiment the ring is deformable, or may even be omitted. According to such embodiments, actuation of the active regions serves to grip and move the shaft as desired, preferably to effect rotation thereof. Note that according to such embodiments, by appropriate actuation of the active regions, the gripping force and the control of movement are sufficient to avoid the need for the shaft to engage a bearing housing. Since other support components are not required, this greatly improves ease of manufacture/assembly since the actuator may be formed from a single moulding of DEA material.

Other alternatives for translating the motion of the DEAs into the desired motion will be apparent to those skilled in the art and are included within the scope of the invention.

Through use of DEAs, it is possible for the actuator and motor of the invention to have a wide range of configurations which were previously not possible. Moreover, while substantially planar configurations are preferred, others may be used because the DEAs are able to work over a curved surface thereby providing greater flexibility in actuator design. Thus, rather than having to design placement of components of an apparatus around an actuator/motor, it is possible, at least to a greater extent, to configure the actuator/motor to fit within the apparatus.

As shown in FIG. 1, DEA 1 consists of soft dielectric material 2 coated with compliant electrodes 3. On application of a high voltage between the electrodes, (out of plane) electrostatic attraction between charges accumulated on the surface electrodes causes the electrodes to be squeezed together. At the same time, like charges on each electrode repel each other (in plane). The attraction and repulsion forces act together to transform the DEA such that its thickness is reduced and its length and width are increased since it is incompressible. Thus, on actuation, the actuator deforms from the first configuration in the upper diagram in FIG. 1 in which the actuator has a thickness t and surface area A to the second configuration in the lower diagram in which the actuator has a reduced thickness and a larger surface area.

Figure 2:
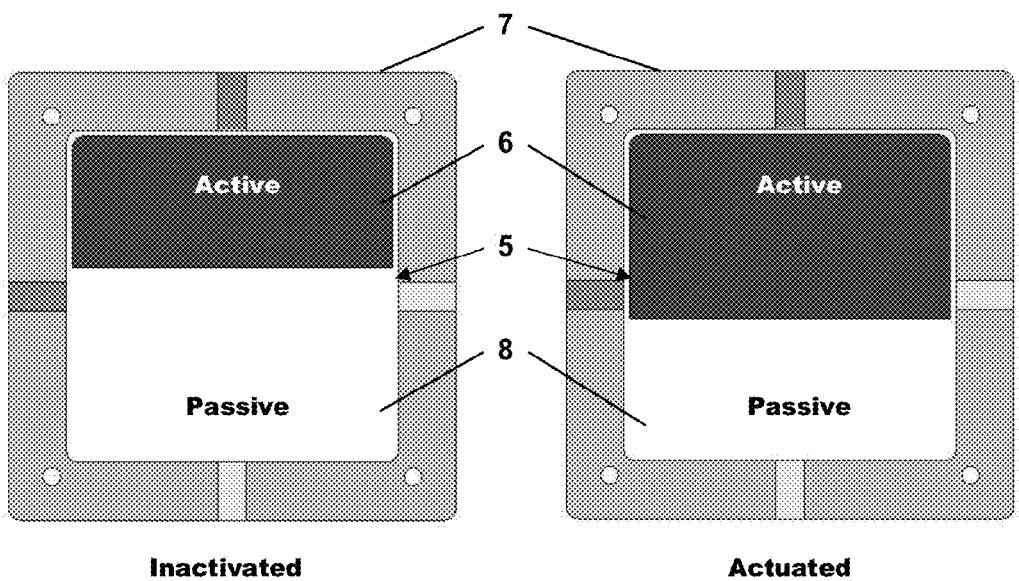
FIG. 2 shows inactivated and actuated states of a stretched membrane DEA.

Embodiments of the invention preferably include a stretched membrane DEA, an example of which is shown in FIG. 2. Pre-stretched elastomer membrane 5 is attached to frame 7. Preferably, frame 7 is substantially rigid. Membrane 5 has at least one active region 6 and at least one passive region 8. An "active region" may be defined as a portion of a dielectric elastomer body which is able to be actuated (i.e., is provided with electrodes that are capable of transferring an applied voltage to that portion of the body). A "passive region" may be defined as a portion of a dielectric elastomer body which is incapable of being actuated (i.e., is not provided with electrodes) or may be an inactivated active region (i.e., it is an active region to which no voltage is being applied). According to preferred embodiments, the passive regions are inactivated active regions (or active regions in the process of being inactivated). This enables opposing active regions to work together to increase the stroke that may be applied thereby. When a voltage is applied, the surface area of active region 6 expands, releasing tension on passive region 8. FIG. 2 shows the actuated and inactivated states of a stretched membrane DEA. The front of the active region is translated into the passive region. This and like translations are used in the DEA actuator and (rotary) motor of the invention.

Figure 3:
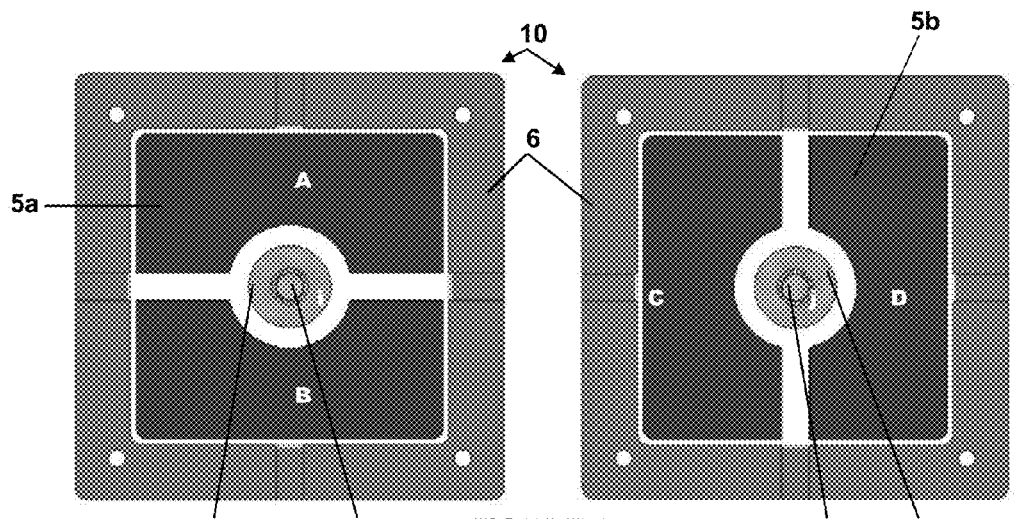
FIG. 3 shows an actuator according to one embodiment.

An actuator 10 according to one embodiment is shown in FIG. 3. Embodiments preferably utilise translational motion of an outer gear supported by one or more DEA membranes to effect rotation of a shaft. While preferred embodiments of mechanisms for the translation of motion are described herein, the invention is not limited thereto.

In the arrangement shown in FIG. 3, two membranes 5a, 5b that are 90° out of phase are used to translate an outer gear 11 around a closed path. The outer gear 11 translates around the rotor 12 which is only able to rotate. The outer gear 11 is in contact with the rotor 12 as it translates around it. This contact is preferably designed so that minimal slip occurs between the outer gear 11 and the rotor 12, such as through use of toothed gears (as shown) or high frictional surfaces.

Figure 4:
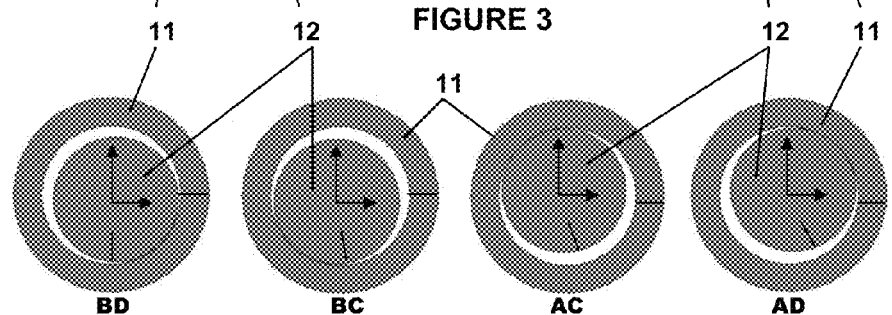
FIG. 4 shows resultant motion resulting from an example activation sequence of the membranes of FIG. 3.

The motions of membranes 5a, 5b are preferably coupled to each other by fixing the outer gears 11 (separately labelled i and j) to each other. Alternatively, they may be integrated as a single unit. Each membrane 5a, 5b has two active regions (labelled A, B, C, and D). By activating these regions in the appropriate sequence, outer gear 11 will translate along a closed path in a clockwise or anti-clockwise motion. The resultant motion of one activation sequence is illustrated in FIG. 4. If the sequence is followed from left to right (i.e., pairs of regions are activated in the sequence BD, BC, AC, AD), rotor 12 rotates in an anticlockwise direction. The direction of rotor 12 is reversed by following the sequence from right to left. The centre of rotor 12 preferably remains at least substantially on the origin (i.e., it does not undergo any significant translation, only rotation) and the marker on rotor 12 rotates about the origin as the outer gear 11 orbits. The marker on the outer gear 11 does not, at least significantly, rotate, it only translates. While translational motion of rotor 12 perpendicular to its axis is preferably inhibited, movement along the axis may be provided for to, for example, effect a gear change.

Figure 5:
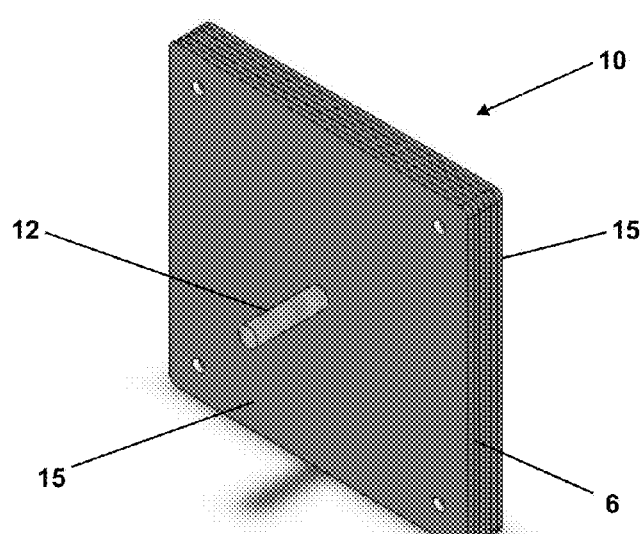
FIGS. 5 and 6 show assembled and exploded views of an actuator of another embodiment.
Figure 6:
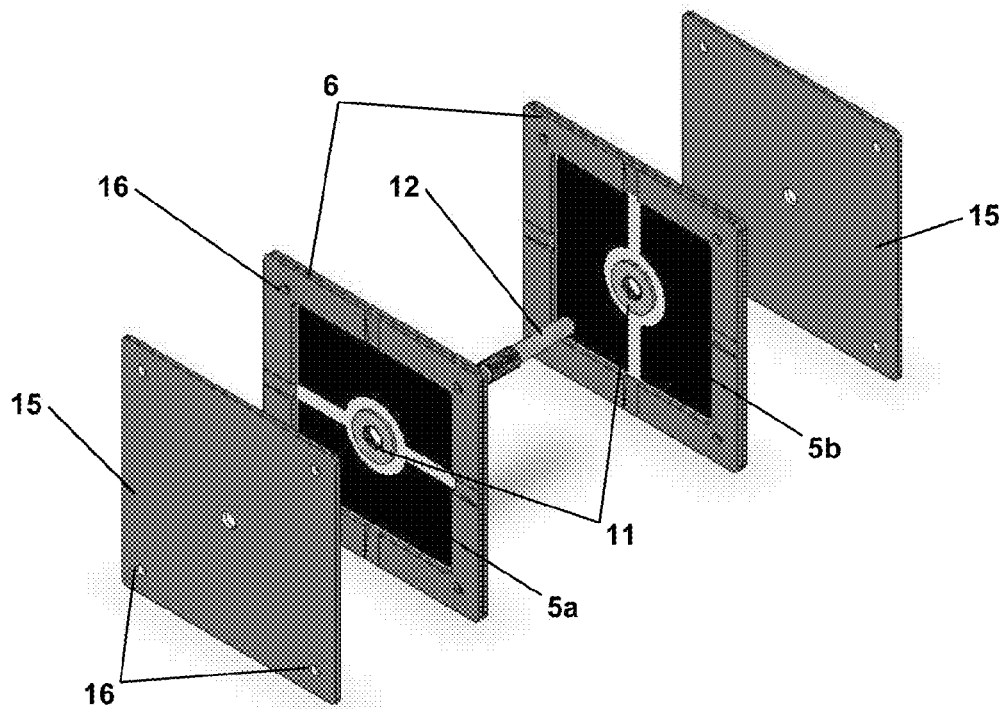

Schematic diagrams of a presently preferred embodiment are provided in FIG. 5 (assembled view) and 6 (exploded view). As will be apparent, these are based on the arrangement shown in FIG. 3. End plates 15 preferably restrict rotor 12 to one, rotational degree of freedom. Apertures 16 may be provided to enable fixings (known to those in the art) to be fitted and lock the apparatus in the assembled form shown in FIG. 5. For example, nuts and bolts or rivets may be used. Such fixings enable the apparatus to be dismantled if required. Other coupling means of a more permanent nature (e.g. welding) may be used.

To produce an actuator or motor that develops more torque, additional DEA pairs that work in the same sequence may be stacked into the device. An example of such an arrangement is provided in FIG. 7. Additionally or alternatively, a rotor with a larger diameter and/or membranes with greater thicknesses and/or enlarged active areas could be used.

Many different actuator or motor designs are possible according to the invention, which is not limited to the specific configurations shown or described. For example, the rotor and outer gear do not need to have round cross-sections and the stretched membrane DEA does not need to be encased in a square frame.

Figure 8:
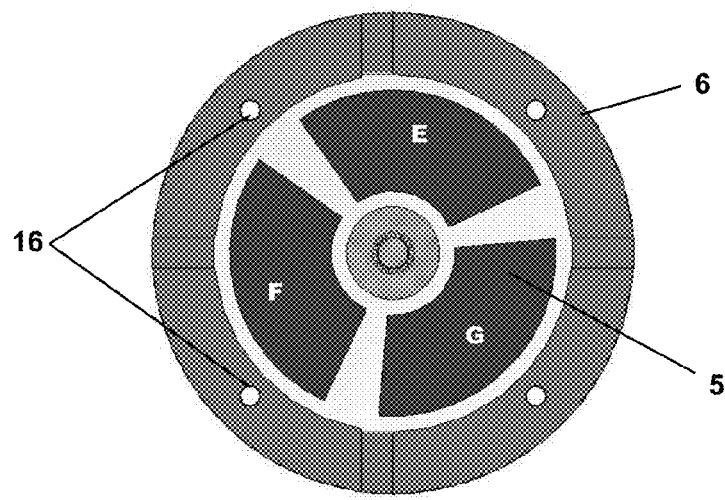
FIGS. 8 to 10 show different views of an actuator of an alternative embodiment.
Figure 9:
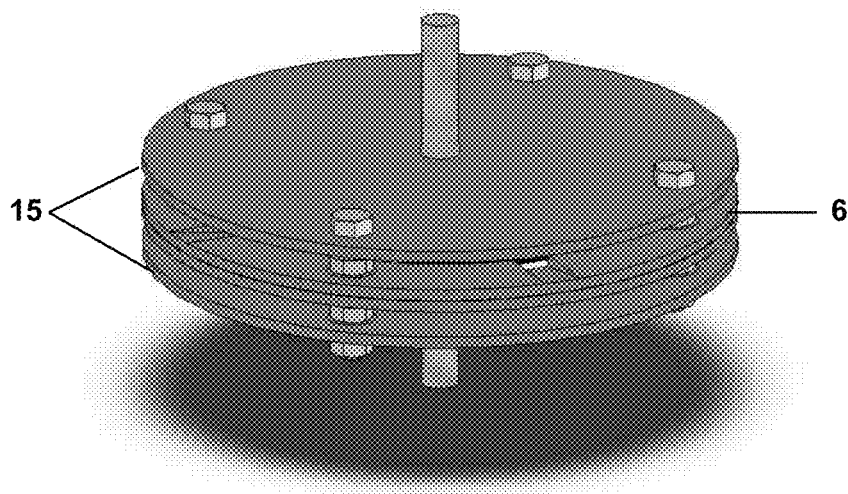
Figure 10:
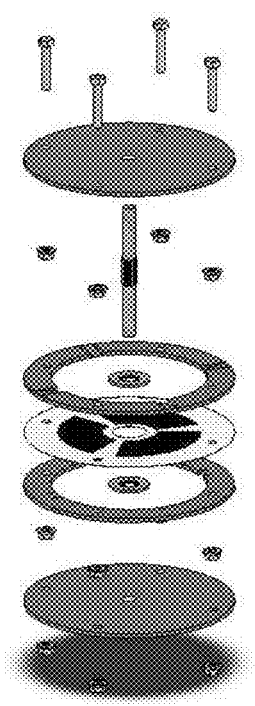

As a further alternative, it is possible to create an actuator for a rotary motor using a single stretched membrane DEA that has multiple phases. One such arrangement is shown in FIGS. 8 to 10. The configuration of this embodiment is similar to that shown in FIGS. 3 and 5 to 7 and reference is made to the description in relation thereto. Only distinctive features of this embodiment will be described.

If the active regions E, F, G of the membrane 5 shown in FIG. 8 are repeatedly actuated in the sequence EF-GE-FG, the stator will translate clockwise around the rotor producing clockwise rotary motion. The active regions may be activated in the sequence FE-E-EG-G-GF-F, referred to herein as a half-step mode. It is to be appreciated that, particularly where the applied voltage is not simply stepped from a zero to a (predetermined) maximum, active regions other than those indicated in any of the aforementioned sequences at any particular point in time may additionally be actuated, at least to some extent.

Figure 8A:
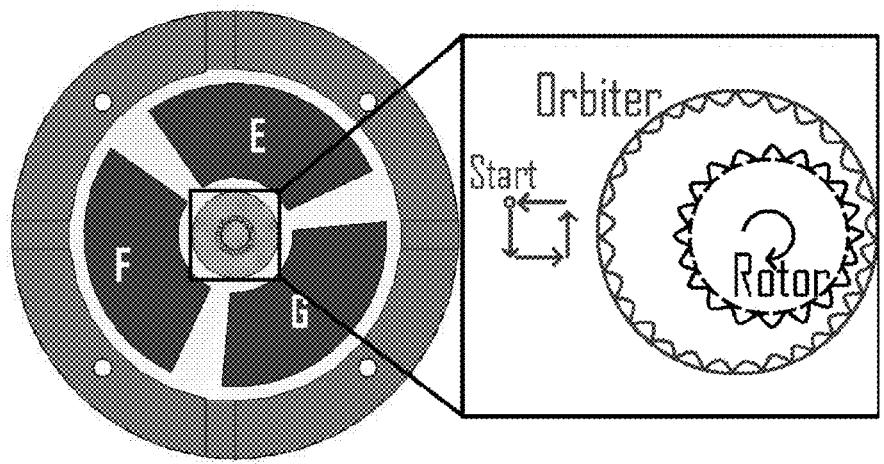
Figure 8B:
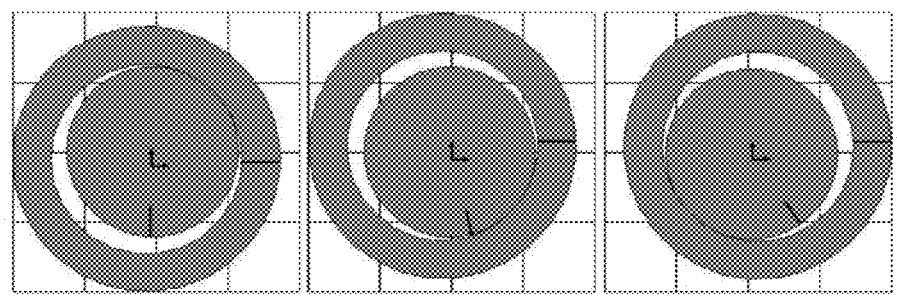

FIGS. 8a and 8b are schematic diagrams showing the motion of the rotor caused by the outer gear or orbiter as the active regions are actuated. The engaging teeth of the rotor and outer gear prevent slip therebetween so that when the outer gear contacts the rotor, the rotor rotates as the orbiter translates. As an alternative to teeth, a friction drive arrangement may be used in which the rotor and/or the outer gear have high friction engaging surfaces.

The embodiments of FIGS. 3 to 11 provide clear advantages over crank arrangements such as that described in U.S. Pat. No. 6,084,321. A significant advantage is the reduced stroke provided by the invention. For crank-based arrangements, the stroke needs to be at least twice the radius of the crank. High stroke requires high voltages (increasing the chance of motor failure due to dielectric breakdown) or low stretch ratios (increasing the influence of viscoelastic effects in the membrane and reducing the frequency at which the motor can be operated). Furthermore, the output torque is necessarily coupled to the stroke of the dielectric elastomer. According to the present invention, the stroke and torque may be effectively decoupled and the required stroke is determined by the necessary clearance between the teeth of the rotor and the outer gear. Thus, the motor of the invention may work in a low stroke/high force/high speed regime as higher stretch ratios can be used, improving reliability. Note that while not preferred, cranking arrangements are included within the scope of the invention.

The stroke may be further reduced through use of a friction drive arrangement. For friction drives, the driving force is proportional to the coefficient of friction between the rotor and the outer gear. Since use of gear teeth effectively sets this coefficient to 1, as opposed to less than 1, the improved driving force and output performance provided by gear teeth will generally outweigh the benefits of the reduced stroke of a friction drive.

Figure 7:
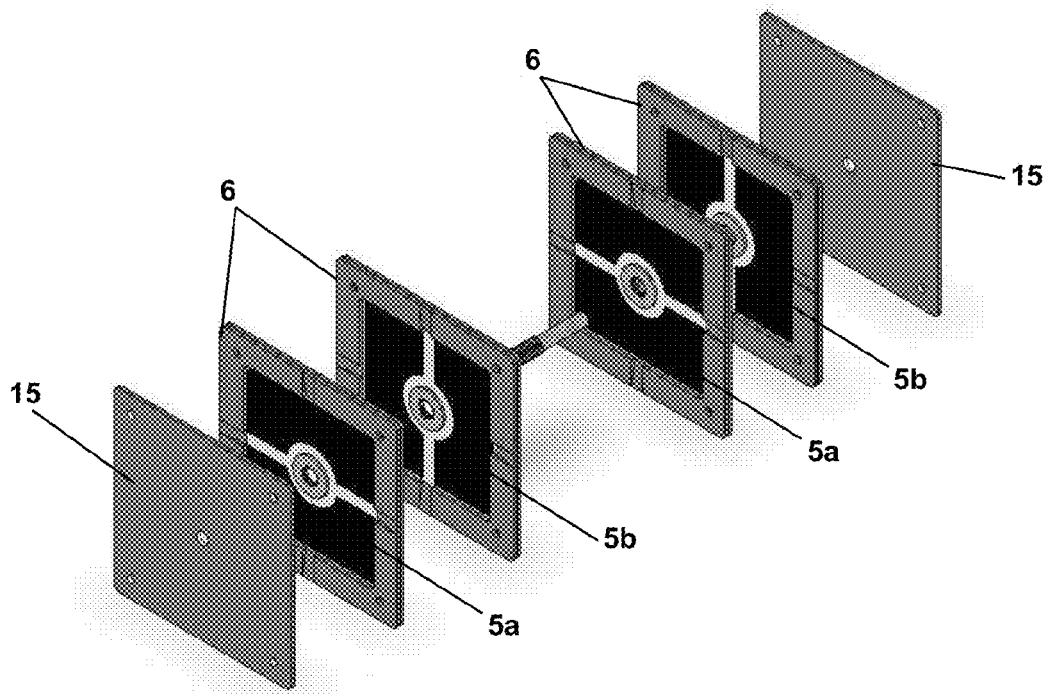
FIG. 7 shows an exploded view of a actuator of an alternative embodiment.
Figure 11:
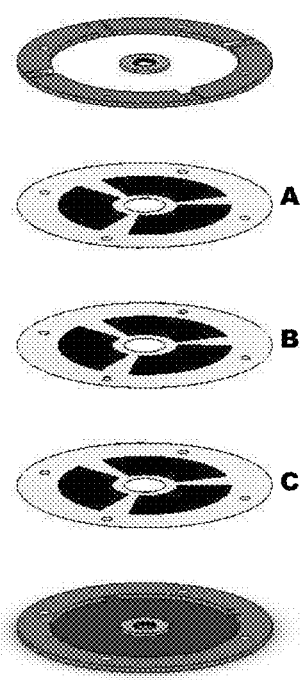
FIG. 11 is an exploded view of a actuator of another embodiment.

As previously mentioned with reference to FIG. 7, additional membranes may be provided to produce additional torque. An alternative arrangement for adding such membranes is shown in FIG. 11 with reference to FIGS. 8 to 10 and is referred to herein as a "stacked membrane DEA". A stacked membrane DEA is a laminate of DEA membranes with electrodes applied between them. This allows a plurality of membranes to be held together in a single frame, rendering the additional weight for generating additional torque negligible. Note that the stacking principle of FIG. 11 may be applied to the arrangement of FIG. 7 and vice versa. Furthermore a combination of the two approaches may be adopted whereby stacked membranes according to the principle of construction of FIG. 11 are bundled together according to the principle of construction of FIG. 7.

In the embodiment of FIG. 11, the membranes are stacked on top of each other with the ground and positive electrodes alternating. For instance, membrane A of FIG. 11 has its positive electrode on the top surface and ground on the lower one, membrane B has its ground electrode on the top surface and positive on the lower one, membrane C has its positive electrode on the top and ground on the lower surface.

Figure 12A:
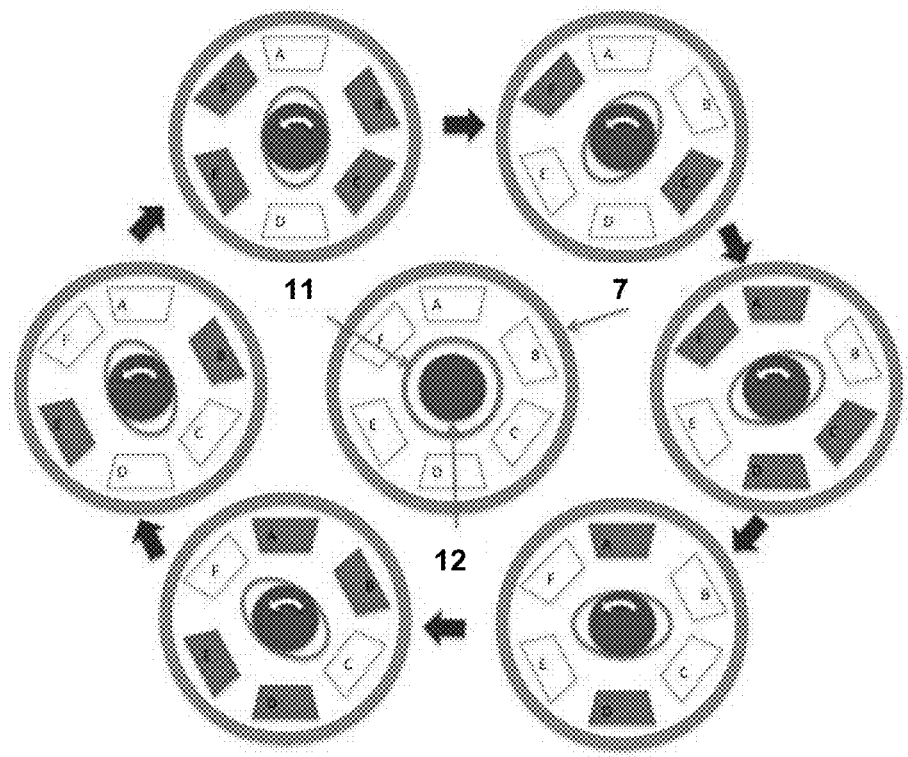
FIGS. 12a and b are schematic diagrams of further embodiments.

FIG. 12a schematically shows an actuator of another embodiment. As with previous embodiments, an outer gear 11 engages a rotor 12. The outer gear 11 is provided at the centre of a preferably equibiaxially stretched elastomer membrane held taut within a substantially rigid frame 7. Unlike previous embodiments, the outer gear 11 is deformable so that simultaneous actuation of electroded zones A to F on opposing sides of the outer gear 11 (axis of actuation) relieve membrane tension in the same direction. The greatest tension on the boundaries of the outer gear 11 will be perpendicular to the axis of actuation causing it to assume an elliptical shape with its long axis in the direction of greatest membrane tension.

FIG. 12a shows the actuator in different states. In the central figure, none of the active regions A to F is actuated. Moving clockwise from the top left diagram in FIG. 12a, the active regions are actuated in the sequence EF-BC→F-C→FA-CD→A-D→AB-DE→E-B, resulting in clockwise rotation of the axes of the deformable outer gear 11 and counterclockwise rotation of the rotor 12.

Irrespective of whether a rigid or non-rigid outer gear 11 is used, the rotational speed generated by the actuator ($f_{rotor}$) relative to one cycle of electrode actuation ($f_{actuation}$) is given by:

$$f_{rotor} = f_{actuation}\left(\frac{r_{orbit} - r_{rotor}}{r_{rotor}}\right)$$

Where $r_{orbit}$ is the radius of the outer gear 11 and is the $r_{rotor}$ radius of the rotor 12.

Unlike previous embodiments in which the substantially rigid outer gear 11 pushed against the rotor 12 supported on its bearings to provide traction, traction can be produced according to the embodiment of FIG. 12a by the gripping action of the deformable outer gear 11 without the need for bearing reactions. The embodiment of FIG. 12a requires fewer parts since no bearings are required and the outer gear 11 is used to hold the rotor 12, eliminating the need for a supporting structure and providing an extra-low profile rotary motor in which all active parts may be set in one plane. A structure may be required to keep the rotor 12 in position within the membrane. This may take the form of end caps rigidly attached to the rotor and having a diameter greater than that of the outer gear 11.

Figure 12B:
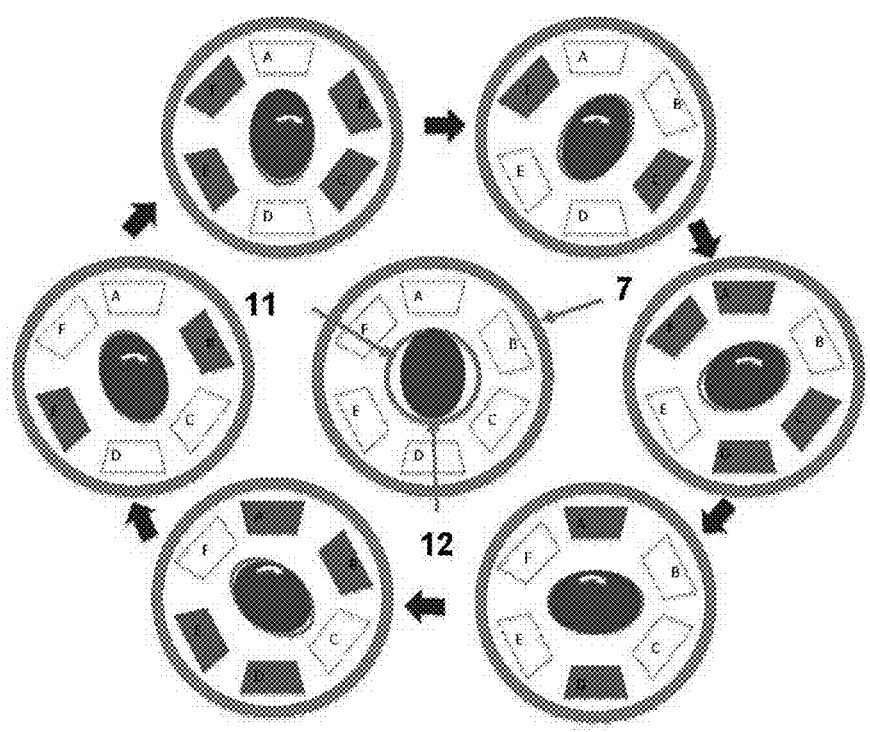

FIG. 12b schematically shows an actuator of another embodiment. The basic arrangement is similar to that of FIG. 12b and only differences will be described. According to this embodiment, the rotor 12 is "out-of-round" or non-circular. In the non-limiting example shown, rotor 12 is elliptical. Other configurations will be apparent to those skilled in the art and are included within the scope of the invention. For example, a multi-lobe configuration may be used.

The outer gear 11 of FIG. 12b is preferably deformable or flexible and preferably, the engaging surfaces of outer gear 11 and rotor 12 are configured or selected such that there is a low coefficient of friction therebetween. Preferably, rotor 12 is at least partially supported by the outer gear 11 when the active areas are deactivated. This may be achieved by the internal dimensions of the outer gear 11 being too small to fit the rotor 12 therein without interference, meaning that the outer gear 11 is slightly stretched to accommodate the rotor 12. In use, actuation of the active areas deforms the outer gear 11 and urges the rotor 12 to rotate, substantially synchronously with and in the same direction as the actuation sequence. Such an arrangement is particularly suited to high speed, low torque applications. Note that similar arrangements may be used to generate alternative motions.

An additional advantage of the arrangement of FIG. 12b is that it is able to operate with the drive means in different orientations relative to the body or membrane (i.e., other than substantially perpendicular thereto). Thus, for applications where the actuator is used to drive a wheel, the orientation of the shaft may vary, for example, as the vehicle moves on its suspension. This also provides tolerance for side loading and may remove the need for a CV-joint between the motor and a driven wheel of a vehicle. These advantages may be conferred to varying degrees by this and other embodiments of the invention using the flexibility of the active areas themselves. Thus, a flexible drive means is not essential to realise these benefits.

FIGS. 13a to 13e show an arrangement for eliminating or at least mitigating problems resulting from lateral movement of the outer gear 11 relative to the rotor and shaft 12. While rotor or inner gear 12 is shown as an attachment to the shaft, it will be appreciated that the inner gear may be integral thereto. Furthermore, provided the inner gear is able to operate within outer gear 11 as described herein, there is no limitation on the shaft diameter. For example, it may be substantially the same as the diameter of the inner gear.

Figure 13A:
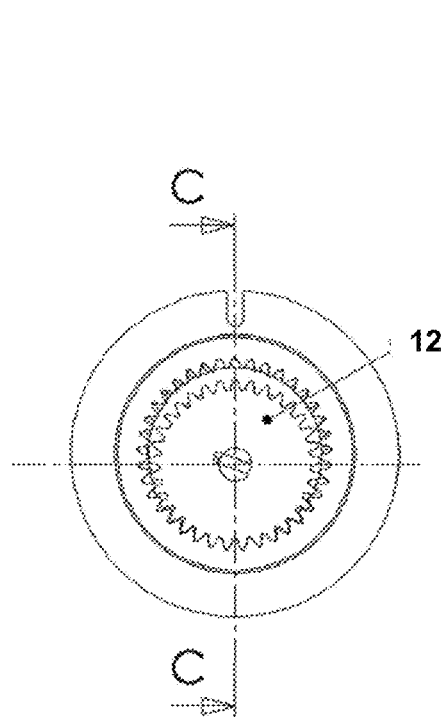
FIGS. 13a-13e provide alternative views of a mechanism of one embodiment for use with the actuator or motor of the invention.
Figure 13B:
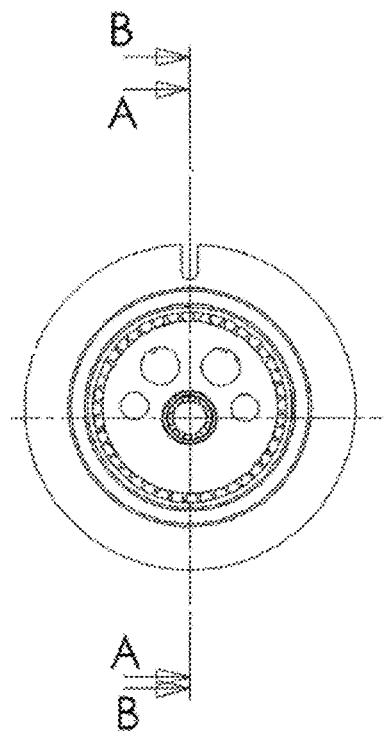
Figure 13C:
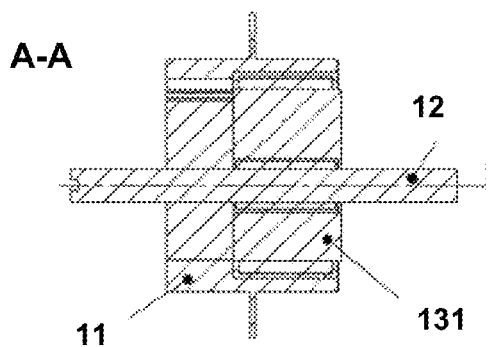
Figure 13D:
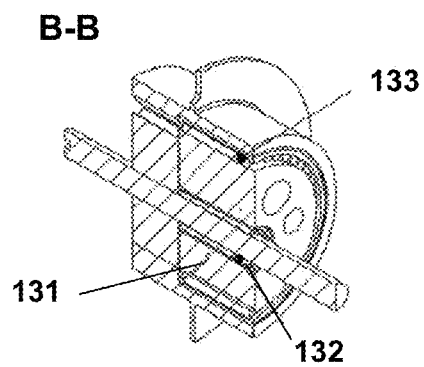
Figure 13E:
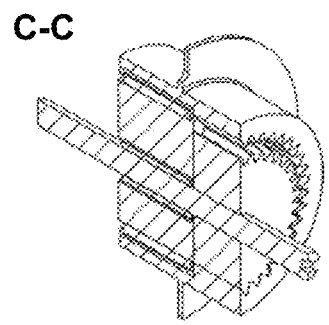

FIGS. 13a and 13b show opposite ends, FIG. 13c shows the cross-section A-A, and FIGS. 13d and 13e are cross-sectional perspective views along B-B and C-C, respectively.

Referring to FIG. 13a, the shaft is provided substantially centrally or axially aligned with rotor 12. However, outer gear 11 is eccentrically positioned relative to the shaft with the position changing as the DEAs are actuated. As will be appreciated, the relative movement between outer gear 11 and rotor 12 causes the alignment of the gear teeth to be lost, creating additional stress and wear. Such movement also adversely affects friction drive arrangements.

According to the embodiment shown in FIGS. 13a to 13e, body 131 is rotatably mounted within a housing via bearings 133. The housing may be provided by or an extension of or coupled to the outer gear 11. Body 131 is further eccentrically, rotatably coupled to the shaft via bearings 132. The eccentricity is selected such that, preferably, the motion of the shaft relative to the inner wall of the housing substantially conforms to that of the shaft relative to the inner wall of the outer gear 11. In other words, the axis of the shaft moves relative to the outer gear 11 and the housing in substantially the same manner, providing for proper alignment of the engaging surfaces, thereby reducing stress (particularly gear tooth stress), friction and wear but increasing the output torque. Thus the axes of each component preferably remain substantially parallel and the spacing between the axis of the shaft and the point of contact with outer gear 12 remains substantially the same.

Preferred embodiments provide a lighter, more efficient and cheaper actuator (and a motor including such an actuator) than conventional technologies, at least for low speed use. Additionally, no magnetic or metallic components are required, potentially making embodiments of the invention suitable for harsh environments, particularly those with large magnetic fields. According to particular embodiments, a uniquely flat motor design is provided, creating new possible applications and simplifying manufacturing. Furthermore, due to the flexible nature of components of the invention, contouring and/or configuration of the apparatus can be adapted to suit particular applications, particularly where space is limited because the driving mechanism is fully flexible and able to be made to fit complex non-planar geometries. This property may also be exploited to enable bending of the apparatus during use. An example application which takes advantage of these characteristics is the window winding motor for a car. Car doors can have complex geometry and are often fairly thin. A flat, bendable, low-speed, efficient and light motor according to embodiments of the invention could be ideal.

The flexible nature of components of the invention has the added advantage of enabling packaging thereof more compactly for transport and/or storage. More particularly, at least a portion of the actuator may be folded or rolled up. Such characteristics would enable actuators to be built into a convertible car roof, with the configuration conforming to that of the roof.

Due to their different underpinning physical principles, actuators according to the invention (including those using stacking arrangements) have different scaling laws than conventional rotary motors. Consequently, particular designs according to the invention may provide for improved performance within specific parameter spaces.

It is important to note that while DEA's may be used as actuators, they may also function as (at least crude) sensors. Consequently, they may provide for smart motor systems capable of providing feedback with no or almost no additional components being required, further enabling costs to be reduced as well as simplifying manufacture.

Other (non-limiting) applications which embodiments of the invention may be particularly suited to include:

general purpose low speed industrial motors e.g for servo control of aircraft systems robotics space exploration (the motor of the invention is lightweight and able to function in extreme environments)

Magnetic Resonance Imaging technologies (due to the absence of magnetic components and any adverse effects caused by magnetic fields).

Experimental

Prototype motors were produced to measure torque at different speeds as detailed below.

Material and Methods

Two motors were fabricated: a three phase motor incorporating an arrangement similar to that of FIG. 8 with three electroded zones (120°/zone) and a four phase motor with four zones (90°/zone). To begin, a square segment of 3M VHB4905 tape was stretched equibiaxially to 16 times its original area using a purpose built stretching rig and attached to a rigid circular frame. At this stretch ratio the thickness of the membrane was reduced from 500 μm in the unstrained state to approximately 31 μm. An orbiter gear was fitted to the centre of each stretched membrane using a purpose-built positioning jig. Areas internal to each frame were brush painted top and bottom with carbon grease to provide deformable electroded zones, each separated by a narrow insulating dead zone. Electrode pathways were painted on the frame to provide coupling to external electrical control circuitry. Each zone was actuated with voltages up to 2.5 kV delivered by an Ultravolt HV (Ultravolt, USA) voltage conditioner. Circuit switching for each zone was provided by high voltage optocouplers (OC100HG, Voltage Multipliers, Inc.) that allowed charging and discharging of each active part of the membrane. These optocouplers were controlled by a Labview Version 7.1 program via a National Instruments PCI Data Acquisition card (NI-6221). Separate experiments were conducted using square and sine wave inputs to sequentially activate the phases on each motor with a half-step actuation mode as described hereinabove.

For the measurement of torque/power characteristics a grooved wheel was attached to the end of the rotating shaft with a string fixed to its outer circumference. The string was wound around a pulley and various masses were hung from it. Starting with no load the frequency of activation of the motor phases was gradually increased until just before the point where the rotor began to skip and no longer turned with a smooth motion. The corresponding angular velocity of the rotor at this point was taken to be the maximum speed of the motor. Following this a small mass was added to the free end of the string and the frequency of activation of the phases was gradually decreased from the peak no-load speed until the motor was able to lift the mass without skipping/stalling. Once this was achieved the rotor speed and the size of the mass were recorded, the mass was increased and again the frequency of activation was gradually decreased until the motor ceased to skip. This process was repeated until frequency of activation reached 0.1 Hz.

Results

Figure 14:
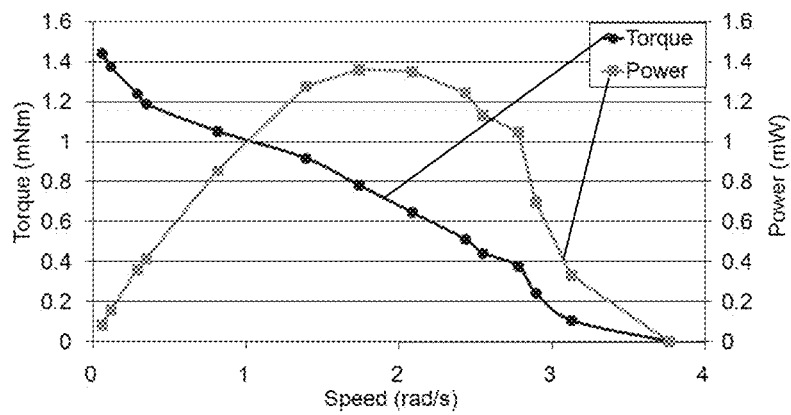
FIGS. 14 and 15 chart torque and power versus speed for a 3-phase motor with square and sinusoidal input signals, respectively.
Figure 15:
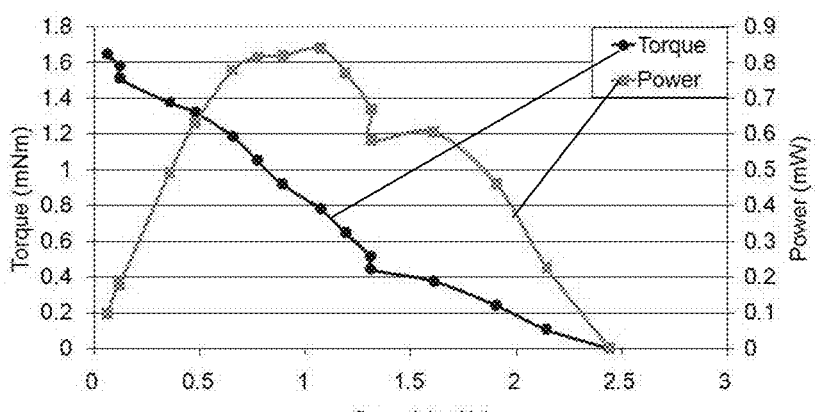

As shown in FIGS. 14 and 15, activation of the 3 phase motor with a square wave input (see FIG. 14) resulted in a higher peak speed (3.8 rad s$^{-1}$) and higher peak power (1.36 mW) compared to the 3 phase motor driven by a sinusoidal input (see FIG. 15). However, with the sine wave input the peak torque output of the motor increased (from 1.51 mNm to 1.72 mNm).

Figure 16:
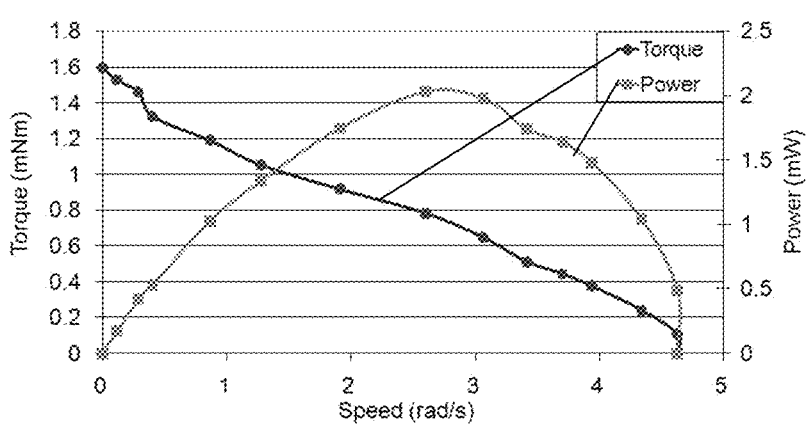
FIGS. 16 and 17 chart torque and power versus speed for a 4-phase motor with square and sinusoidal input signals, respectively.
Figure 17:
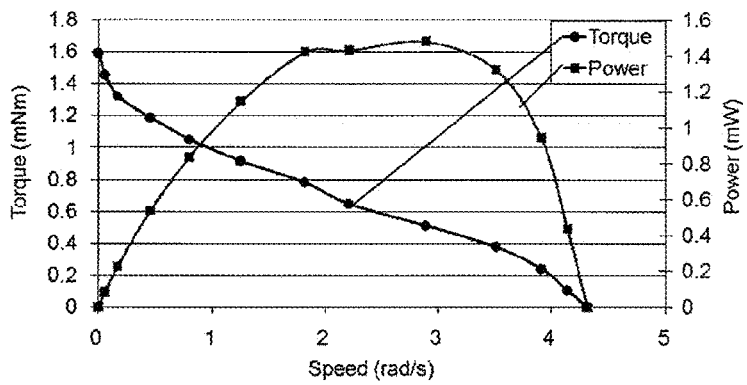

FIGS. 16 and 17 show similar results obtained for the 4 phase motor. Again, the peak speed (4.6 rad s$^{-1}$) and output power (2 mW) were higher using a square wave input (see FIG. 16) as opposed to a sinusoidal input (see FIG. 17). The peak torque for both inputs was substantially the same.

Figure 18:
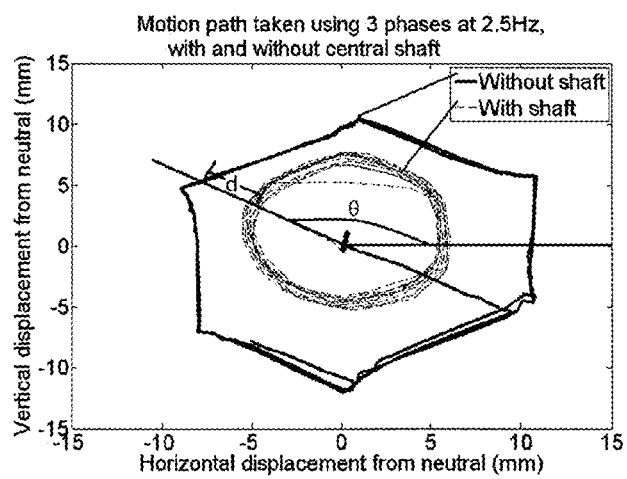
FIGS. 18 and 19 show the path of the centre of the orbiter for a 3- and 4-phase motor, respectively, in a half step mode with and without the rotor.
Figure 19:
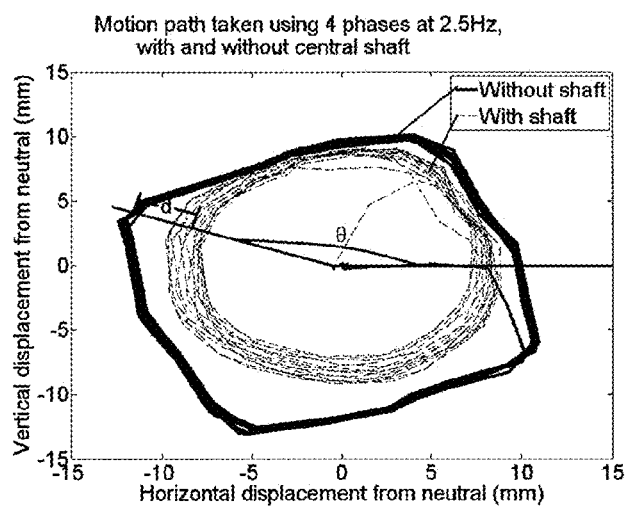

Image processing techniques were used to monitor motion of the centre of the orbiter as it moved throughout the cycle. The results are plotted in FIGS. 18 and 19 for the path of the orbiter with and without the rotor gear for both the 3 and 4 phase motors operating as stepper motors. The inner path of each Figure is with the rotor gear, and the outer path without. It can be seen that the force developed by the motor is proportional to the difference between the outer and inner path at some angle θ during the cycle and good motor design may maximize the minimum distance around the cycle to eliminate slip.

Discussion

Based on the torque and power versus speed curves the specific power and specific torque outputs of the motors were calculated for both the entire mass of the motor (including the rigid frames, the gears, the rotor shaft and the bearings) and for just the mass of the DEA membrane itself. The results are presented in Tables 1 and 2. As can be seen the specific power and specific torque of both motors when just the membrane is considered are over two orders of magnitude greater than that calculated when the entire mass of the motor is taken into account. This is due to the fact that in the current configuration the mass of the membrane at 0.256 g represents merely 0.28% of the total mass of the motor.

TABLE 1

Motor Power

| Motor Phase | Signal | Peak Power (mW) | Specific Power (mW/g) | | Speed at peak power (rad/s) |
|---|---|---|---|---|---|
| | | | Incl. frame | Membrane only | |
| 3 | Square | 1.36 | 0.015 | 5.31 | 1.74 |
| 3 | Sinusoidal | 0.84 | 0.009 | 3.28 | 1.07 |
| 4 | Square | 2.03 | 0.022 | 7.95 | 2.60 |
| 4 | Sinusoidal | 1.48 | 0.016 | 5.78 | 2.89 |

TABLE 2

Motor Torque

| Motor Phase | Signal | Peak torque (mNm) | Specific Torque (mNm/g) | |
|---|---|---|---|---|
| | | | Incl. frame | membrane only |
| 3 | Square | 1.51 | 0.017 | 5.91 |
| 3 | Sinusoidal | 1.72 | 0.019 | 6.70 |
| 4 | Square | 1.60 | 0.017 | 6.23 |
| 4 | Sinusoidal | 1.60 | 0.017 | 6.23 |

It is envisaged that for a single membrane motor the weight of the (plastic) frames could be reduced by more than 70% by reducing their thickness. Additionally or alternatively, performance can be improved by stacking additional membrane layers on top of each other. In such a configuration, each layer only increases the thickness of the motor by 31 μm and the mass by 0.256 g, yet the increase in contact forces able to be delivered between the motor gears results in improved torque and power output. To put this in context, the AM-2224 two-phase miniature stepper motor commercially available from Arsape has a mass of 43 g, a peak operating torque of 15 mNm and power of 510 mW. An estimate of how many membrane layers must be added to the 4 phase orbital motor (driven with a square wave) to make it competitive with the AM-2224 is presented in Tables 3 and 4. The results show that by reducing the mass of the frames the DEA orbital motor is extremely competitive with the AM-2224 for specific power and specific torque. Note that the AM-2224 is capable of higher operating speeds and finer position resolution but there is wide scope for a simple, lightweight motor that delivers its peak power at a relatively low speed, such as in many robotic applications.

TABLE 3

AM-2224 Power

| Motor | Peak Power (mW) | Mass (g) | Layers Required | DEA Motor Mass (g) | |
|---|---|---|---|---|---|
| | | | | Incl. frame | Mem. only |
| AM-2224 | 510 | 43 | 251 | 155.6 | 64.2 |

TABLE 4

| | AM-2224 Torque | | | | |
|---|---|---|---|---|---|
| | Peak | | | DEA Motor Mass (g) | |
| Motor | Torque (mNm) | Mass (g) | Layers Required | Incl. frame | Mem. only |
| AM-2224 | 15 | 43 | 10 | 93.9 | 2.56 |

Sufficient insulation needs to be used with embodiments of the invention in view of the high voltages required. The voltage may be reduced by using a dielectric elastomer with improved permittivity (3M VHB tape has a relative permittivity of only 3 or 4). This can be achieved using high permittivity additives but these can compromise dielectric breakdown strength, dielectric loss, and failure strain. An alternative approach to reducing the voltage is to use stacked and electroded membrane layers that are significantly thinner than the membrane described above. The same electric field may be maintained with much reduced voltages.

The actuators and motors of the invention are inherently scalable, amenable to deposition-based manufacturing approaches and use relatively inexpensive materials. They are silent in operation and provide a good power to weight ratio. They need not be planar and may fit curved geometries to allow close integration into, say, robotic components.

The entire disclosures of all applications, patents and publications cited above and below, if any, are herein incorporated by reference. However, reference to any prior art in this specification should not be taken as an acknowledgement or suggestion that that prior art forms part of the common general knowledge in the field of endeavour in any country in the world.

Wherein the foregoing description reference has been made to integers or components having known equivalents, those integers are herein incorporated as if individually set forth.

Various changes and modifications to the presently preferred embodiments described herein will be apparent to those skilled in the art. Such changes and modifications may be made without departing from the spirit and scope of the invention and without diminishing its attendant advantages. It is therefore intended that such changes and modifications be included within the scope of the invention.

The embodiments of the invention in which an exclusive property or privilege is claimed are defined as follows:

1. An actuator including:
    one or more body formed from a dielectric elastomer, each body having at least one active region; and
    a drive means directly or indirectly coupled to each active region and formed by or coupled to an edge portion of at least one said body, the edge portion being defined by an aperture in the one or more body, wherein:
    an engaging portion of the drive means is configured to engage a driven means such that only a part of the engaging portion is operably engaged with the driven means at any point in time,
    the at least one active region is arranged such that actuation thereof causes the part of the engaging portion engaged with the driven means to change and the driven means to move, the motion of the drive means including components in at least first and second directions, and
    the second direction is non-parallel to the first direction.

2. The actuator of claim 1 wherein the drive means is flexible.

3. The actuator of claim 2, wherein the driven means extends through the one or more body.

4. The actuator of claim 1, wherein said body and drive means are at least one of integrally formed or are formed from a single moulding process.

5. The actuator of claim 1, including at least two said active regions.

6. The actuator of claim 1 wherein each active region is defined by a pair of electrodes coupled to or integral to the dielectric elastomer of the corresponding body.

7. The actuator of claim 6, wherein the actuator includes or is adapted to be coupled to means for selectively applying a voltage to the electrodes of each active region, and wherein the means for selectively applying a voltage is configured to apply a voltage to each active region in at least one of a controlled or predetermined sequence so as to cause the driven means to move in a desired manner.

8. The actuator of claim 7, including a plurality of said bodies arranged such that the active regions of each said body are out of phase with the active regions of each adjacent body.

9. The actuator of claim 2, wherein actuation of the active regions causes the driven means to rotate about an axis, and the orientation of the axis is variable.

10. The actuator of claim 1, wherein the or at least one body of the one or more body is in the form of a membrane.

11. The actuator of claim 1, wherein the first and second directions are at least one of substantially within or substantially parallel to a plane of the one or more body.

12. The actuator of claim 1 including support means for supporting the one or more body.

13. The actuator of claim 12, wherein the or at least one body is stretched prior to coupling thereof to the support means.

14. The actuator of claim 1, wherein the engaging surfaces of at least one of the drive means or the driven means are configured to minimize slip therebetween.

15. The actuator of claim 2 wherein the engaging surfaces of at least one of the drive means or the driven means are configured to allow slip therebetween, and the driven means has a non circular cross-section in the axis of rotation.

16. The actuator of claim 1, including the driven means.

* * * * *